United States Patent [19]

Masuda

[11] Patent Number: 4,566,016
[45] Date of Patent: Jan. 21, 1986

[54] DUAL INTENSITY LASER BEAM PICTURE RECORDING METHOD

[75] Inventor: Tatsunosuke Masuda, Kyoto, Japan

[73] Assignee: Dainippon Screen Seizo Kabushiki Kaisha, Japan

[21] Appl. No.: 582,085

[22] Filed: Feb. 21, 1984

[30] Foreign Application Priority Data

Mar. 24, 1983 [JP] Japan .................................. 58-47890

[51] Int. Cl.⁴ .......................... G01D 9/00; G01D 9/42
[52] U.S. Cl. ..................................... 346/108; 346/1.1; 358/296
[58] Field of Search ..................... 346/107 R, 108, 1.1, 346/160; 358/296, 293

[56] References Cited

U.S. PATENT DOCUMENTS 4,044,363  8/1977  Morgan ............................... 346/108
4,212,018  7/1980  Ohnishi .............................. 346/108

*Primary Examiner*—E. A. Goldberg
*Assistant Examiner*—Mark Reinhart
*Attorney, Agent, or Firm*—Hayes, Davis & Soloway

[57] ABSTRACT

A desired picture or pattern such as a wiring pattern may be recorded on a recording surface bearing a photosensitive material coated thereon by sweeping a light beam obtained from a light beam source and then scanning, with the thus-swept light beam, the recording surface. A portion of the swept light beam is branched out by a half-mirror and then fed to optical sweep position detecting means. The light beam from the light beam source is modulated by a picture signal obtained in synchronization with a position signal produced by the detecting means on the basis of the thus-detected portion of the swept light beam in such a way that the thus-modulated light beam is continuously maintained, at least, at such a low light quantity level that is too small to expose the photosensitive material substantially. The method is useful for the fabrication of distortion-free printed circuits. Owing to the use of only one light beam, the method has cut the manufacturing cost of a picture recording system which is useful to practice the method.

3 Claims, 4 Drawing Figures

DUAL INTENSITY LASER BEAM PICTURE RECORDING METHOD

BACKGROUND OF THE INVENTION (1) Field of the Invention:

This invention relates to a method for recording a picture such as a wiring pattern or the like by printing the picture on a picture-forming material coated with a film of a photosensitive material, such as a board suitable for use in the fabrication of a printed circuit, in accordance with input picture signals without developing dimensional distortion.

(2) Description of the Prior Art:

Wiring patterns may be formed on insulated boards, which are suitable for use in the fabrication of printed electronic circuits, in accordance with either contact or direct exposure method.

According to the contact exposure method, a board bearing a resist film coated on the surface thereof is exposed to light with a mask film, in which a negative or positive pattern has been formed, kept in contact with the resist film. The thus-exposed board is then developed to fabricate a resist pattern.

The contact exposure method is however accompanied by such drawbacks that it takes first of all several hours to prepare a mask film of a desired picture or pattern for example by means of a coordinate plotter or the like; and dimensional distortion occurs with a wiring pattern formed on an insulated board as such a mask film undergoes shrinkage or expansion and hence develops distortion by variations in temperature and/or humidity. If such a dimensional error arises, some inconvenience would be encountered when drilling the resulting printed circuit in a subsequent step because the positions of at least some holes would be offset from the thus-printed circuit.

Different from the aforementioned conventional contact exposure method, the direct exposure method forms a picture or pattern in the following manner without using any mask film. Namely, two-dimensional picture data are stored as digital picture signals in a memory or the like. The thus-stored picture data are thereafter read out as picture signals. Then, an insulated board, which is suitable for use in the fabrication of a printed circuit, is scanned by light which has in advance been controlled by the picture signals.

FIG. 1 is a block diagram illustrating one example of conventional direct exposure systems.

In a memory 1, there are stored binary picture signals arranged two-dimensionally. The picture signals are controlled by a central processing unit (hereinafter called "CPU" for the sake of brevity) 2 in such a way that they are converted to time-series scanning signals for recording a picture or pattern, which corresponds to the binary picture signals stored in the memory 1, by the scanning technique. The resulting scanning signals are fed to an acousto-optic light modulator 3.

A light beam output from an exposing light beam source, for example, an argon ion laser tube 4 is ON-OFF modulated by the acousto-optic light modulator 3 and is then guided to a polyhedral reflector 7 by way of an expander 9 and fixed mirrors 5,6. Individual reflecting surfaces of the polyhedral reflector 7 are rotated by a motor 8, whereby reflecting and sweeping the exposing light beam in a direction perpendicular to the sheet of the drawing with a prescribed spread angle (sweep angle).

Then, the exposing light beam travels through a focusing lens 10 arranged very close to the polyhedral reflector 7 and is thereafter reflected by a fixed mirror 11 disposed at a position adjacent to an insulated board 12 suitable for use in the fabrication of a printed circuit. The light beam then sweeps and radiates the unexposed insulated board 12 while forming image points thereon.

The insulated board 12 is fixedly mounted on a stage 13, which is movable at a constant speed in a direction perpendicular to the beam-sweeping direction (i.e., in the direction indicated by an arrow O in the figure) owing to the provision of a motor 14 so as to form a subscanning feed mechanism.

When the polyhedral reflector 7 is rotated and the stage 13 is moved, the insulated board 12 is thus plane-scanned successively, at the image point of the exposing light beam, all over the surface thereof.

The accuracy of movement of the stage 13 in the subscanning direction, which movement is achieved by mechanically driving the stage 13, may be maintained at a required level without substantial difficulties in the direct exposure system so long as the motor 14 and force-transmitting mechanism are designed suitably. However, the accuracy of the beam sweeping speed and width which pertain to the rotation of the polyhedral reflector 7, in other words, the accuracy in the main scanning direction is governed by the design and machining preciseness of the optical system which includes the polyhedral reflector 7, focusing lens 10, etc. It is not easy to minimize errors, which are caused by designing and/or machining aspects, to satisfactory levels. Furthermore, it is extremely difficult from the technical viewpoint to maintain the linearity of the angle of rotation of the polyhedral reflector 7 and that of image points along the sweeping line of the light beam with sufficient accuracy.

FIG. 2 is a block diagram of a conventional exposure system which has purportedly overcome the above-described drawbacks.

In FIG. 2, all elements or parts of structure identified by the same reference numerals as those used in FIG. 1 serve in the same manner as their corresponding elements or parts depicted in FIG. 1. Explanation on such elements is thus omitted.

The system illustrated in FIG. 2 is additionally equipped with a narrow grille-like scale 15, photosensor 16 and auxiliary laser tube 17 compared with the system shown in FIG. 1. Furthermore, the fixed mirrors 5,11 have been replaced by half-mirrors 5',11'.

FIG. 3 illustrates a part of the narrow grille-like scale 15 shown in FIG. 2.

In FIG. 2, the narrow grille-like scale 15 is placed in conjugated relation with the point of exposure of the insulated board 12, i.e., the image point on the recording surface of the insulated board 12 relative to the half-mirror 11'.

Similar to the system depicted in FIG. 1, a laser beam output from the argon laser tube 4 is caused to sweep the unexposed insulated board 12 so that the insulated board 12 is exposed to the laser beam. On the other hand, the auxiliary laser tube 17 is arranged in such a way that each laser beam, which is to be output from the laser tube 17, can follow the same optical axis as laser beams output from the argon laser tube 4. The laser beam output from the auxiliary laser tube 17 has a wavelength that is outside a color sensitivity range in which a photosensitive material coated on the insulated board 12 is exposed. The laser beam output from the auxiliary laser tube 17 sweeps the insulated board 12 and, at the same time, also sweeps the front surface of the narrow grille-like scale 15 in a direction parallel to the length of the scale 15.

The laser beam, which has scanned the narrow grille-like scale 15, is then allowed to pass through the openings (see, FIG. 3) of the scale, thereby converted to a laser beam which is repeatedly turned off at a frequency proportional to the sweeping speed. The latter laser beam then enters the photosensor 16.

The photosensor 16 converts the thus-input laser beam to pulse signals in accordance with the sweeping speed. The resulting pulse signals are then input to the CPU 2, which reads out picture signals from the memory 1 in synchronization with the pulse signals. Therefore, a distortion-free picture or pattern is exposed on the insulated board 12.

In the conventional system depicted in FIG. 2, two types of laser beams having different frequencies are used. Even if a focusing lens minimized in chromatic aberration is used as the focusing lens 10, certain residual chromatic aberration (with respect to magnification) still remains. In addition, further aberration may also occur at the half-mirror 11', depending on the incident angle of each laser beam. Accordingly, there is another drawback that the narrow grille-like scale 15, which is illustrated in FIG. 3, has to be formed into non-linear configurations so as to correct such errors.

Since there is a rather long distance from the polyhedral reflector 7 to the insulated board 12 when conducting the exposure of the insulated board 12 by sweeping the laser beam at the polyhedral reflector 7, a further drawback may be developed unless the optical axes of the two laser beams are coincided completely. Namely, a difference may be developed between the scanning points of both laser beams on the insulated board 12, depending on the extent of the beam sweeping angle.

SUMMARY OF THE INVENTION

With the foregoing in view, the present invention has as its object the provision of a picture recording method which permits to improve the accuracy of each recorded picture or pattern and also to lower the manufacturing cost of a picture recording system, which is suited to practice the picture recording method, compared with the prior art method illustrated in FIG. 2 by using only one laser tube.

In one aspect of this invention, there is thus provided a method for recording a desired picture by sweeping a light beam obtained from a light beam source and then scanning, with the thus-swept light beam, a recording surface on which a photosensitive material has been coated, the improvement which comprises that a portion of the swept light beam is branched out by a half-mirror and then fed to optical sweep position detecting means, and the light beam from the light source is modulated by a picture signal obtained in synchronization with a position signal produced by the detecting means on the basis of the thus-detected portion of the swept light beam in such a way that the thus-modulated light beam is continuously maintained, at least, at such a low light quantity level that is too small to expose the photosensitive material substantially.

The above method of this invention has made it possible to reduce the overall manufacturing cost of a picture recording system, which is suitable for use in the practice of the method, owing to the use of a single piece of laser tube, although the aforementioned conventional method required an expensive system due to the inevitable dependence on two laser tubes.

Furthermore, the present invention does not require to take chromatic aberration into consideration, thereby permitting to use an inexpensive focusing lens as the focusing lens 10. It is only necessary to think of aberration of only one color with respect to the narrow grille-like scale 15 the details of which are shown in FIG. 3.

The principal feature of this invention resides in the use of a single piece of laser tube only. This has made optical axis alignment work, such as that required when two laser tubes were used, unnecessary. Besides, the above method has completely solved errors which were caused by variations in scanning angle, which variations were in turn developed due to a difference between the two optical axes.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENT

The present invention has been completed taking a hint from the exposure characteristic, in other words, the relationship between the exposing light quantity and the density of the resulting developed picture or pattern in a photosensitive material coated on an insulated board which is useful to fabricate a printed circuit. Namely, the present invention uses, generally speaking, a photosensitive material which is useful in the fabrication of printed circuits and has high $\gamma$-characteristics that it is not exposed at all by light of a certain light quantity or smaller but is certainly exposed by light having a light quantity greater than the certain light quantity.

Figure 4:
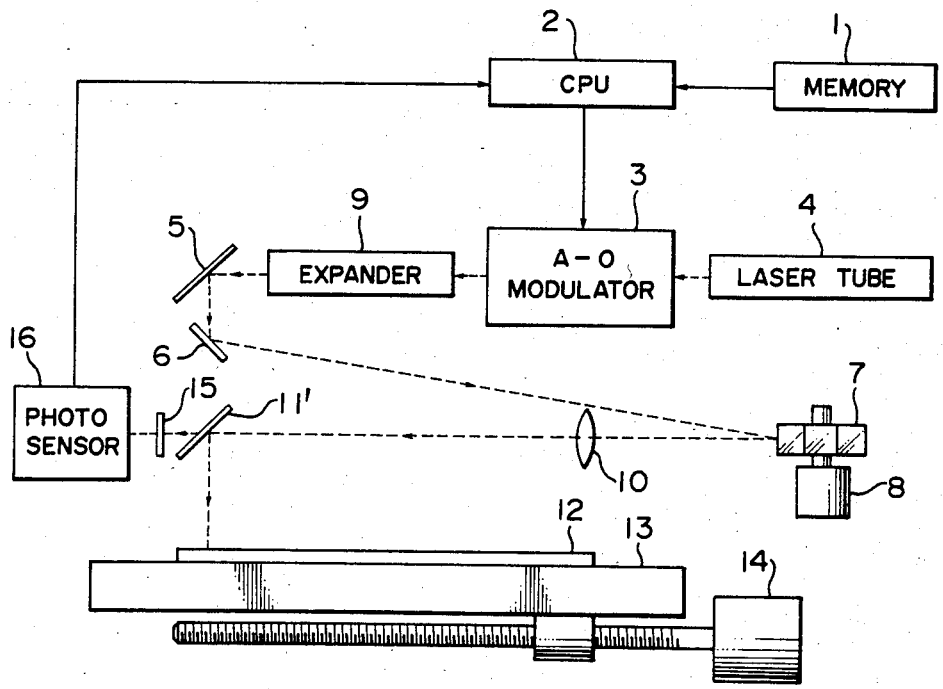
FIG. 4 is a block diagram of a picture recording system which is useful in the practice of the picture recording method of this invention.

One embodiment of this invention will hereinafter be described with reference to FIG. 4. The picture recording system of FIG. 4 is different from that depicted in FIG. 2 in that the auxiliary laser tube 17 has been removed and the half-mirror 5' has been replaced by a fixed mirror 5.

Figure 1:
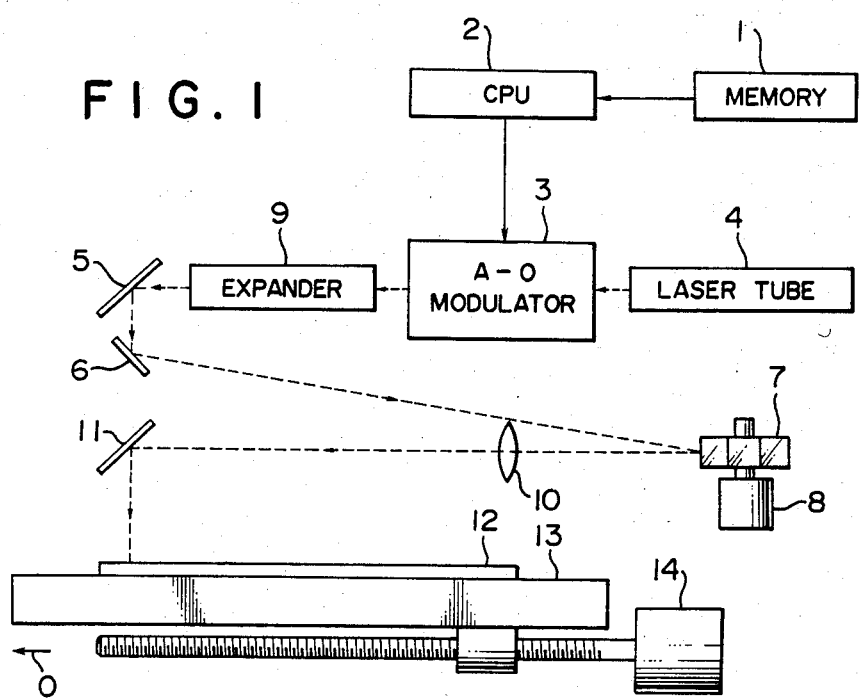
FIG. 1 is a block diagram illustrating one example of conventional direct exposure systems which have been employed to fabricate printed circuits.
Figure 2:
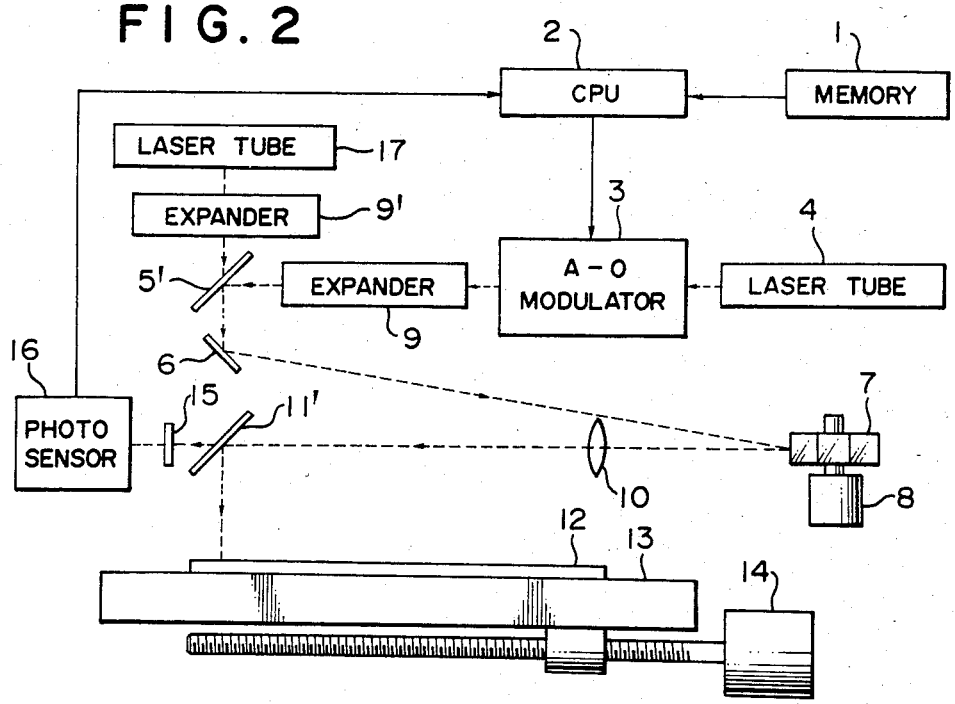
FIG. 2 is a block diagram of a conventional direct exposure system making additional use of an auxiliary laser beam and adapted to fabricate printed circuits.
Figure 3:
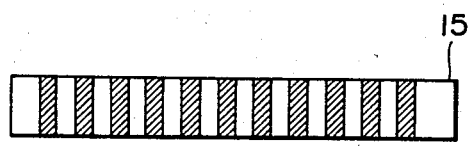
FIG. 3 is a front view of one example of the narrow grille-like scale depicted in FIG. 2.

As described with reference to FIG. 2, the input laser beam is modulated at the acousto-optic light modulator 3 in accordance with binary picture signals fed from the CPU 2 and is then output from the acousto-optic light modulator 3 as laser beams having two different light quantity levels, namely, a laser beam having such an intensity that permits to expose the photosensitive material and another laser beam having such an intensity that does not permit to expose the photosensitive material but permits the photosensor 16 to detect the laser beam as pulses.

The bi-level laser beam modulation-controlling technique making use of the acousto-optic light modulator 3 and the laser beam detection technique relying upon the photosensor 16 are by themselves not targets of the present invention. Any suitable known art may be used for such purposes. Accordingly, such techniques are not described in detail in the present specification.

The present invention permits to omit one of two laser tubes and, in addition, to use a lens which is not specially designed to reduce chromatic aberration. Thus, the present invention has brought about such advantageous effects that such assembly and adjustment work as optical axis alignment has been rendered unnecessary, the manufacturing cost of a color recording system has been reduced, and the aggravation of errors due to variations in scanning angle, which variations occur by the non-alignment of the optical axes of two laser beams, has been successfully avoided.

In the above embodiment, the narrow grille-like scale 15 and photosensor 16 are used. It may be feasible to employ a one-dimensionally disposed photoelectric array sensor instead of such a scale and photosensor.

Having now fully described the invention, it will be apparent to one of ordinary skill in the art that many changes and modifications can be made thereto without departing from the spirit or scope of the invention as set forth herein.

What is claimed is:

1. In a method of recording desired images on a photosensitive material including the steps of modulating a light beam generated from a light source by modulating means, deflecting said modulated light beam by deflecting means, separating said deflected light beam by a half mirror whereby one of said separated light beams reflected by said half mirror is scanned on the photosensitive material to record desired images thereon, and the other separated light beam is fed to photosensor means through grating means, said method characterized in that:

a first intensity of the light beam generated by said light source is maintained at a low enough intensity not capable of sensitizing said photosensitive material, said first intensity light beam is always modulated according to said grating means, and a second intensity of the light beam for recording, modulated at a high enough intensity for sensitizing said photosensitive material, whereby said two kinds of light beams modulate in such a manner as described above and are binarily controlled by said modulating means.

2. The recording method as claimed in claim 1, wherein the optical sweep position detecting means comprises a narrow grille-like scale disposed in conjugated relationship with an image point on the recording surface relative to the half-mirror, at which image point the recording surface is exposed to the swept light beam, and a photosensor.

3. The recording method as claimed in claim 1, wherein the optical sweep position detecting means is a photoelectric array sensor disposed one-dimensionally in a plane which is scanned by the portion of the swept light beam.

* * * * *